(12) United States Patent
Cho et al.

(10) Patent No.: US 9,246,125 B2
(45) Date of Patent: Jan. 26, 2016

(54) ORGANIC LIGHT-EMITTING DIODE DISPLAY

(71) Applicant: SAMSUNG DISPLAY CO., LTD., Yongin, Gyeonggi-do (KR)

(72) Inventors: Dai-Han Cho, Yongin (KR); Sang-Hee Lee, Yongin (KR); Kwan-Young Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 226 days.

(21) Appl. No.: 14/093,635

(22) Filed: Dec. 2, 2013

(65) Prior Publication Data

US 2014/0361958 A1    Dec. 11, 2014

(30) Foreign Application Priority Data

Jun. 7, 2013    (KR) ........................ 10-2013-0065467

(51) Int. Cl.
*G09G 3/30*    (2006.01)
*H01L 51/52*    (2006.01)
*G09G 3/32*    (2006.01)

(52) U.S. Cl.
CPC ................ *H01L 51/524* (2013.01); *G09G 3/32* (2013.01); *G09G 3/3208* (2013.01); *G09G 3/30* (2013.01)

(58) Field of Classification Search
CPC ......... G09G 3/30; G09G 3/32; G09G 3/3208; G09G 3/3233; G09G 3/3258
USPC ................ 345/76–84, 90–100; 313/498–512; 349/58
See application file for complete search history.

(56) References Cited

U.S. PATENT DOCUMENTS

| | | | | |
|---|---|---|---|---|
| 7,960,913 B2 * | 6/2011 | Yee et al. | ........................ | 313/512 |
| 7,961,456 B2 * | 6/2011 | Ha et al. | .................... | 361/679.21 |
| 8,369,107 B2 * | 2/2013 | Cho et al. | ........................ | 361/829 |
| 8,641,240 B2 * | 2/2014 | Wang et al. | .................... | 362/362 |
| 2012/0212928 A1 | 8/2012 | Lee et al. | | |

FOREIGN PATENT DOCUMENTS

| | | |
|---|---|---|
| KR | 1020090093058 | 9/2009 |
| KR | 1020120038265 | 4/2012 |
| KR | 1020120096263 | 8/2012 |

* cited by examiner

*Primary Examiner* — Vijay Shankar
(74) *Attorney, Agent, or Firm* — F. Chau & Associates, LLC (57) ABSTRACT

An organic light-emitting diode display including: a display panel; a bezel on which the display panel is mounted; and a buffer disposed between a lower surface of the display panel and the bezel. The buffer includes a peripheral buffer and a central buffer that has a step-shaped structure. The peripheral buffer is disposed at first and second sides of the central buffer.

19 Claims, 6 Drawing Sheets

ORGANIC LIGHT-EMITTING DIODE DISPLAY

CROSS-REFERENCE TO RELATED PATENT APPLICATION

This application claims priority under 35 U.S.C. §119 to Korean Patent Application No. 10-2013-0065467, filed on Jun. 7, 2013, in the Korean Intellectual Property Office, the disclosure of which is incorporated by reference herein in its entirety.

TECHNICAL FIELD

The present invention relates to an organic light-emitting diode (OLED) display, and more particularly, to an OLED display including a buffer.

DISCUSSION OF THE RELATED ART

An organic light-emitting diode (OLED) display is a self-emission type display that includes a hole injection electrode, an electron injection electrode, and an organic light emitting layer formed between the hole injection electrode and the electron injection electrode. In the OLED display, light is generated as holes injected from an anode and electrons injected from a cathode recombine in the organic light emitting layer to an excited state that then gradually decays.

The OLED display has high-quality characteristics, such as low power consumption, high luminance, and high response speeds. Thus, it is being used as a next generation display for portable electronic devices. However, since an OLED display panel is susceptible to being marked or pressed by an external shock, a defect may occur.

SUMMARY

The present invention provides an organic light-emitting diode (OLED) display including a buffer that prevents a defect from occurring in an outer surface of a panel.

According to an exemplary embodiment of the present invention, there is N an OLED display including: a display panel; a bezel on which the display panel is mounted; and a buffer disposed between a lower surface of the display panel and the bezel. The buffer may include a peripheral buffer and a central buffer that has a step-shaped structure. The peripheral buffer may be disposed at first and second sides of the central buffer.

The central buffer may have a width that decreases from the lower surface of the display panel toward the bezel.

The peripheral buffer and the central buffer may be spaced apart from each other.

The central buffer may include: a first central buffer disposed on the lower surface of the display panel; and a second central buffer disposed on a lower surface of the first central buffer. A width of the second central buffer may be less than a width of the first central buffer.

The central buffer may include: a third central buffer disposed on a lower surface of the second central buffer. A width of the third central buffer may be less than the width of the second central buffer.

A side of the peripheral buffer may contact the first or second side of the central buffer.

The buffer may include: a first adhesive layer disposed between a substrate and the peripheral buffer and between the substrate and the central buffer.

The buffer may include: a second adhesive layer disposed on a lower surface of the peripheral buffer.

The second adhesive layer may include a conductive adhesive layer.

A lower surface of the second adhesive layer and a lower surface of the central buffer may contact the bezel.

The peripheral buffer may include sponge or urethane.

The central buffer may include silicon, a polyethylene (PET) film, or rubber.

The display panel may include: a substrate; a driving circuit unit disposed on the substrate and comprising a thin film transistor; an OLED disposed on the substrate and connected to the driving circuit unit; and a sealing layer disposed on the substrate and covering the OLED and the driving circuit unit.

The bezel may include: a bottom part on which the display panel is mounted; and a sidewall which extends from an edge of the bottom part to face a side of the display panel.

The OLED display may further include: a transmission part covering an upper part of the display panel and an upper part of the bezel.

According to an exemplary embodiment of the present invention, there is provided an OLED display including: a display panel; a bezel on which the display panel is mounted; and a buffer disposed between a lower surface of the display panel and the bezel. The buffer may include a peripheral buffer and a central buffer that has a lower part with a convexly curved surface. The peripheral buffer may be disposed at first and second sides of the central buffer.

The peripheral buffer and the central buffer may be spaced apart from each other.

The buffer may include: a first adhesive layer disposed between a substrate and the peripheral buffer and between the substrate and the central buffer.

The buffer may include: a second adhesive layer disposed on a lower surface of the peripheral buffer.

A lower surface of the second adhesive layer and a lower surface of the central buffer may contact the bezel.

A thickness of the central buffer from an uppermost part of the central buffer to a lowermost part of the central buffer may be greater than a sum of a thickness of the peripheral buffer and a thickness of the second adhesive layer.

The peripheral buffer may include sponge or urethane.

The central buffer may include silicon, a PET film, and rubber.

According to an exemplary embodiment of the present invention, there is provided an OLED including: a buffer disposed between a display panel and a bezel, the buffer including a first buffer disposed at first and second sides of a second buffer, wherein a width of the second buffer decreases from the display panel to the bezel.

BRIEF DESCRIPTION OF THE DRAWINGS

The above and other features of the present invention will become more apparent by describing in detail exemplary embodiments thereof with reference to the attached drawings in which.

DETAILED DESCRIPTION OF THE EMBODIMENTS

Exemplary embodiments of the present invention will now be described more fully with reference to the accompanying drawings. The invention may, however, be embodied in many different forms and should not be construed as being limited to the embodiments set forth herein.

As used herein, the singular forms "a", "an", and "the" are intended to include the plural forms as well, unless the context clearly indicates otherwise. In the drawings, the thicknesses of layers and regions may be exaggerated for clarity. Like reference numerals in the drawings and specification may denote like elements.

It will also be understood that when a layer is referred to as being "on" another layer or substrate, it can be directly on the other layer or substrate, or intervening layers may also be present.

Figure 1:
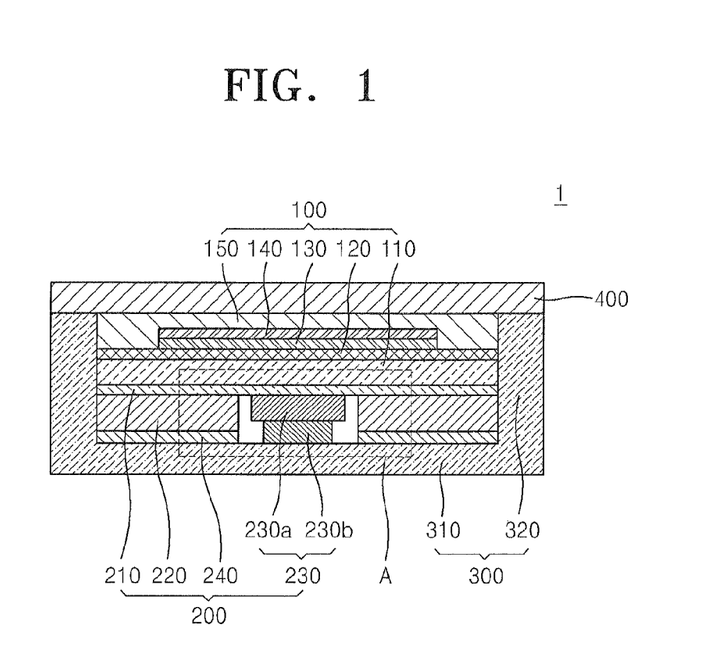
FIG. 1 is a cross-sectional view illustrating an organic light-emitting diode (OLED) display according to an exemplary embodiment of the present invention.

FIG. 1 is a cross-sectional view illustrating an organic light-emitting diode (OLED) display 1 according to an exemplary embodiment of the present invention.

The OLED display 1 according to the present exemplary embodiment includes a peripheral buffer 220 that is formed on a lower surface of a substrate 110 and a central buffer 230 that is enclosed by the peripheral buffer 220 and has a step-shaped structure. The central buffer 230 may be partly or fully enclosed by the peripheral buffer 220. For example, the peripheral buffer 220 may be disposed at first and second sides of the central buffer 230, but not at third and fourth sides of the central buffer 230. Therefore, the OLED display 1 is prevented from being marked or pressed by an external shock, and thus the reliability of the OLED display 1 is improved.

Referring to FIG. 1, the OLED display 1 includes a display panel 100, a bezel 300 in which the display panel 100 is mounted, a transmission part 400, and a buffer 200.

The display panel 100 includes the substrate 110, a driving circuit unit 130, an OLED 140, and a sealing layer 150.

The substrate 110 may be formed of plastic, such as polyethylene ether phthalate, polyethylene naphthalate, polycarbonate, polyarylate, polyetherimide, polyethersulfone, polyimide, or the like. The substrate 110 may be formed as a metallic substrate formed of stainless steel or thin glass. The substrate 110 may be flexible.

Figure 9:
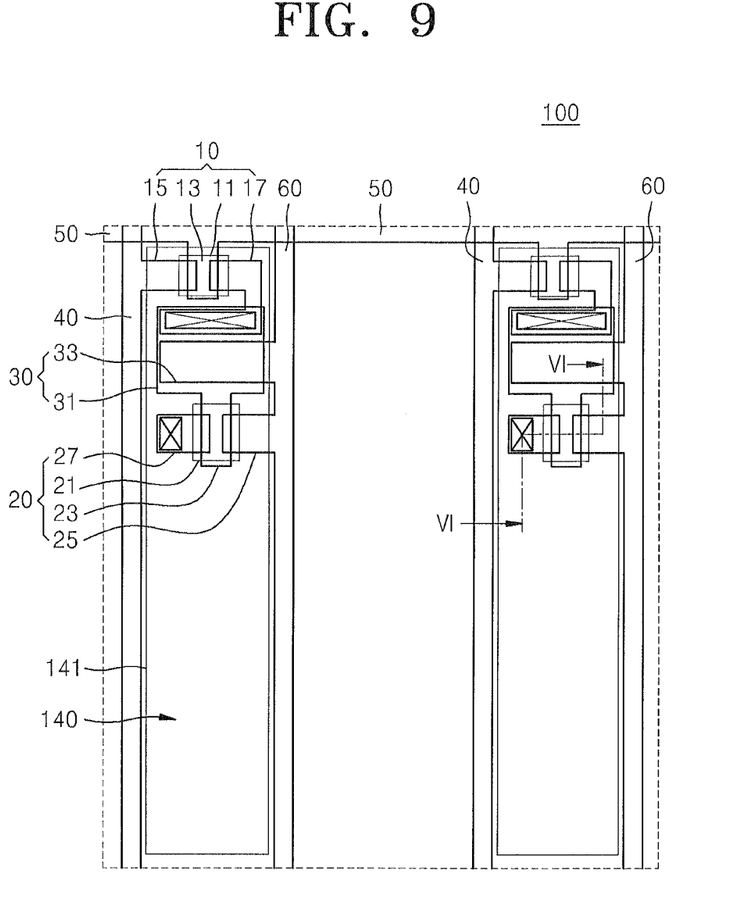
FIG. 9 is a view illustrating a pixel structure of a display panel according to an exemplary embodiment of the present invention.
Figure 10:
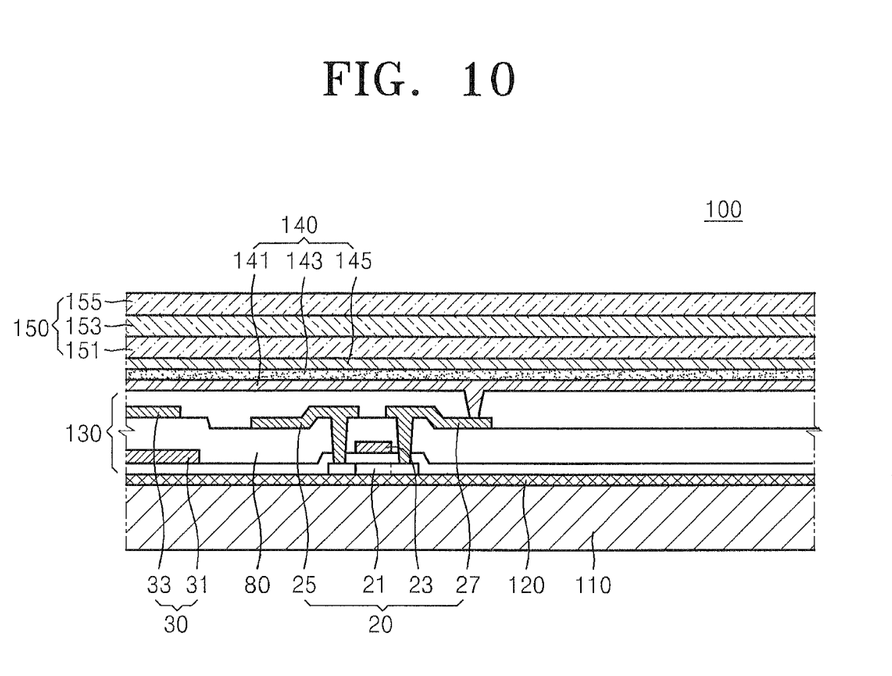
FIG. 10 is a cross-sectional view of the display panel taken along line VI-VI of FIG. 9, according to an exemplary embodiment of the present invention.

The driving circuit unit 130 includes thin film transistors (TFTs) 10 and 20 of FIGS. 9 and 10 and drives the OLED 140. The OLED 140 is connected to the driving circuit unit 130 and emits light according to a driving signal transmitted from the driving circuit unit 130 to display an image.

Detailed structures of the driving circuit unit 130 and the OLED 140 are illustrated in FIGS. 9 and 10. However, the present invention is not limited to the structures of FIGS. 9 and 10. The driving circuit unit 130 and the OLED 140 may have various forms.

The sealing layer 150 is formed to cover the driving circuit unit 130 and the OLED 140 and may be formed in a multilayer structure (not shown). The sealing layer 150 may be formed of a plurality of inorganic layers or may be formed of inorganic layers and organic layers that alternate with one another. According to an exemplary embodiment of the present invention, the sealing layer 150 may be formed of various types of inorganic layers and organic layers.

The display panel 100 may further include a barrier layer 120 that is disposed between the substrate 110 and the driving circuit unit 130.

The barrier layer 120 may be formed of at least one or more layers selected from various types of inorganic layers and organic layers. Water that has permeated the OLED 140 shortens a lifespan of the OLED 140. Therefore, the barrier layer 120 prevents an unnecessary component or contaminant, such as water, from passing through the substrate 110 and permeating the OLED 140.

The bezel 300 includes a bottom part 310 on which the display panel 100 is mounted and a sidewall 320 that extends from an edge of the bottom part 310 toward the display panel 100 to face a side of the display panel 100. A structure of the bezel 300 is not limited to the illustrated example and may be variously modified.

The bezel 300 may be formed of a material having high hardness, for example, a metallic material such as stainless steel, cold-drawn steel, aluminum (Al), an Al alloy, a nickel (Ni) alloy, or the like. Alternatively, the bezel 300 may be formed of a synthetic resin material, for example, polymer-based engineering plastic, such as polycarbonate.

The transmission part 400 is disposed in a display area of the display panel 100 and transmits light emitted from the display panel 100. The transmission part 400 may be formed of glass or a transparent synthetic resin film. The synthetic resin film may be a polyethylene (PET) film, a polypropylene (PP) film, a polyamide (PA) film, a polyacetal (POM) film, a polymethylmethacryate (PMMA) film, a polybutylene-terephtalate (PBT) film, a polycarbonate (PC) film, a cellulose film, or a damp-proof cellophane. The transmission part 400 may be formed of a synthetic resin film to have high transparency, wear resistance, shock resistance, and damp-proofing characteristics, as well as tough and strong characteristics.

The transmission part 400 is disposed in the display area of the display panel 100 and thus may have a shape corresponding to a shape of the display area of the display panel 100.

The buffer 200 includes the peripheral buffer 220, the central buffer 230, and a first adhesive layer 210.

The peripheral and central buffers 220 and 230 perform buffer functions, and the central buffer 230 is enclosed by the peripheral buffer 220 and has a step-shaped structure. The first adhesive layer 210 is disposed between the substrate 110 and the peripheral and central buffers 220 and 230 and locates the peripheral and central buffers 220 and 230 on a lower surface of the substrate 110.

The peripheral buffer 220 may be formed of urethane that is formed in a synthetic resin form by using a sponge formed through foaming of a rubber solution or a rubber solution. However, the present invention is not limited thereto.

The central buffer 230 is formed at a predetermined distance from the peripheral buffer 220. The central buffer 230 includes first and second central buffers 230a and 230b that are sequentially stacked in this order on the first adhesive layer 210 to form the step shape.

The first central buffer 230a is wider than the second central buffer 230b, and the first and second central buffers 230a and 230b may be formed of the same type of material.

The central buffer 230 may be formed of silicon, a PET film, or a rubber material that may be elastically deformed. However, the present invention is not limited thereto.

The buffer 200 may further include a second adhesive layer 240 that is disposed on a lower surface of the peripheral buffer 220.

The second adhesive layer 240 combines the display panel 100 and the bottom part 310 of the bezel 300 with each other. The second adhesive layer 240 may be a conductive adhesive layer and prevent the OLED display 1 from being broken down by static electricity.

According to an exemplary embodiment of the present invention, the buffer 200 may include the central buffer 230 and the peripheral buffer 220 that are formed of a plurality of layers. The central buffer 230 may be formed in a step shape. Therefore, a pressure difference occurring at a boundary between the central buffer 230 and the peripheral buffer 220 may be reduced, and thus the OLED display 1 may be prevented from being marked or pressed by an external shock.

Figure 2:
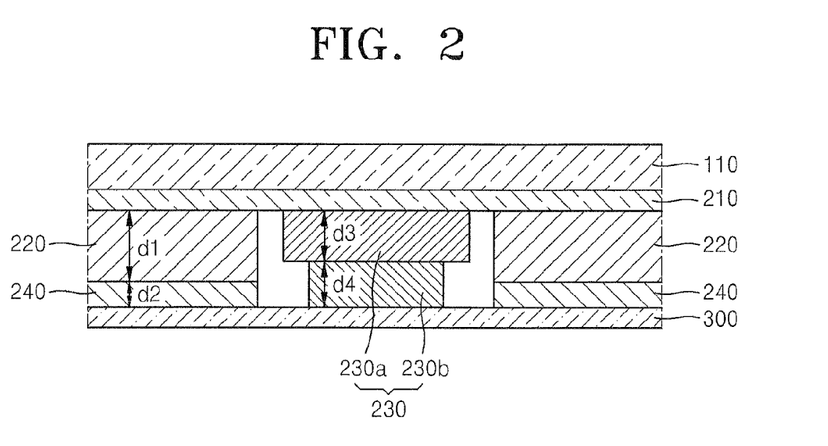
FIG. 2 is a cross-sectional view illustrating an enlarged region A of FIG. 1, according to an exemplary embodiment of the present invention.

FIG. 2 is a cross-sectional view illustrating an enlarged region A of FIG. 1, according to an exemplary embodiment of the present invention.

Referring to FIG. 2, a sum d1+d2 of a thickness d1 of the peripheral buffer 220 and a thickness d2 of the second adhesive layer 240 is equal to a thickness d3+d4 of the central buffer 230. d3 is a thickness of the first central buffer 230a and d4 is a thickness of the second central buffer 230b. Therefore, a lower surface of the second adhesive layer 240 contacts the bezel 300 to be combined with the bezel 300, and the second central buffer 230b of the central buffer 230 may also contact the bezel 300.

FIGS. 3 through 7 are cross-sectional views illustrating a structure of the region A of FIG. 1, according to exemplary embodiments of the present invention. Here, the reference numerals of FIGS. 3 through 7 that are as the same as those of FIGS. 1 and 2 refer to the same elements, and thus their descriptions may be omitted.

Figure 3:
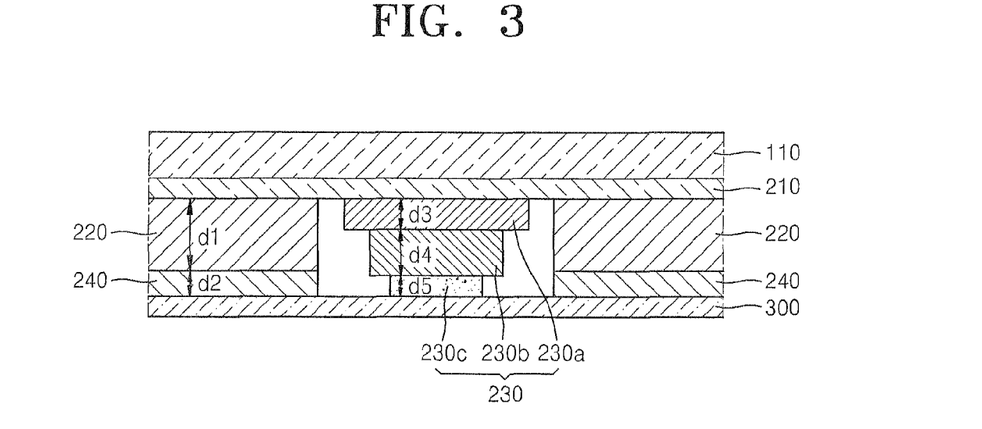
FIGS. 3 through 7 are cross-sectional views illustrating a structure of the region A of FIG. 1, according to exemplary embodiments of the present invention.

Referring to FIG. 3, the buffer 200 includes the peripheral buffer 220 and the central buffer 230 that is enclosed by the peripheral buffer 220 and has a step-shaped structure. The peripheral buffer 220 and the central buffer 230 keep a predetermined distance from each other.

Different from that shown in FIG. 2, the central buffer 230 includes first, second, and third central buffers 220a, 220b, and 220c that form three layers. The first, second, and third central buffers 220a, 220b, and 220c form the step-shaped structure of the central buffer 230 with widths that gradually decrease towards the bezel 300.

A sum d1+d2 of a thickness d1 of the peripheral buffer 220 and a thickness d2 of the second adhesive layer 240 is equal to a thickness d3+d4+d5 of the central buffer 230. d3 is a thickness of the first central buffer 230a, d4 is a thickness of the second central buffer 230b and d5 is a thickness of the third central buffer 230c. Therefore, a lower surface of the second adhesive layer 240 contacts the bezel 300 to be combined with the bezel 300, and the third central buffer 230c of the central buffer 230 may also contact the bezel 300.

Figure 4:
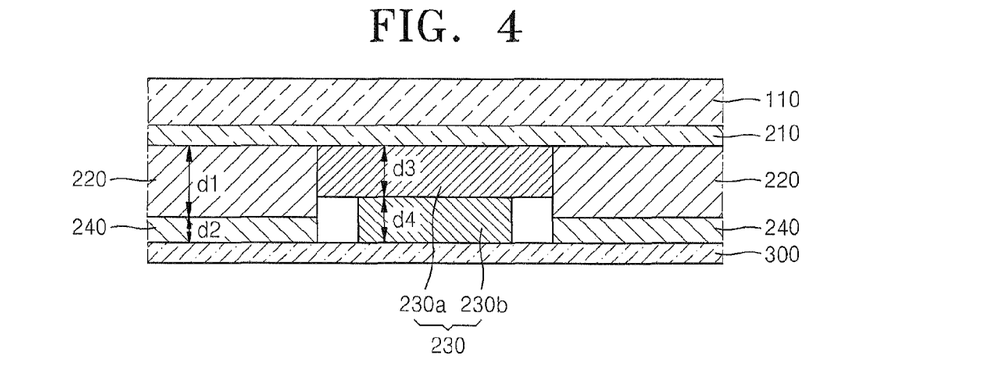

Referring to FIG. 4, the buffer 200 includes the peripheral buffer 220 and the central buffer 230 that is enclosed by the peripheral buffer 220 and has a step-shaped structure. The central buffer 230 includes first and second central buffers 230a and 230b having widths that gradually decrease towards the bezel 300.

Different from that shown in FIG. 2, a side of the peripheral buffer 220 contacts a side of the first central buffer 230a.

Figure 5:
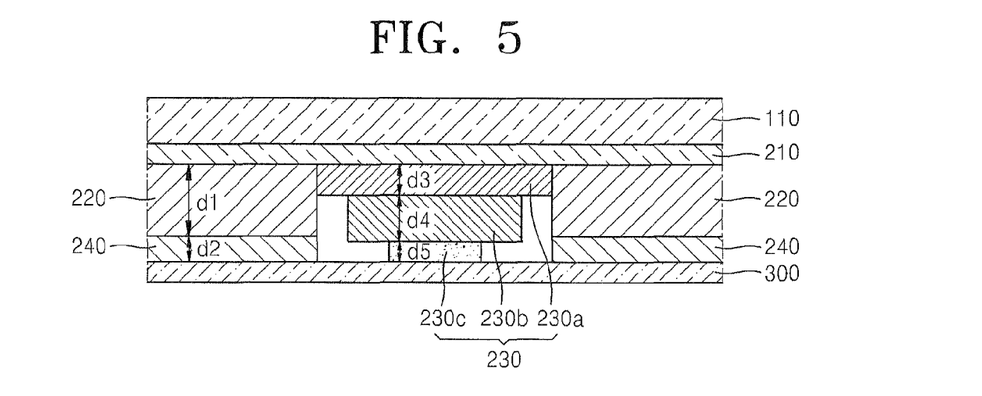

Referring to FIG. 5, the buffer 200 includes the peripheral buffer 220 and the central buffer 230 that is enclosed by the peripheral buffer 220 and has a step-shaped structure. The central buffer 230 includes the first, second, and third central buffers 230a, 230b, and 230c having widths that gradually decrease towards the bezel 300.

Different from that shown in FIG. 3, a side of the peripheral buffer 220 contacts a side of the first central buffer 230a.

Figure 6:
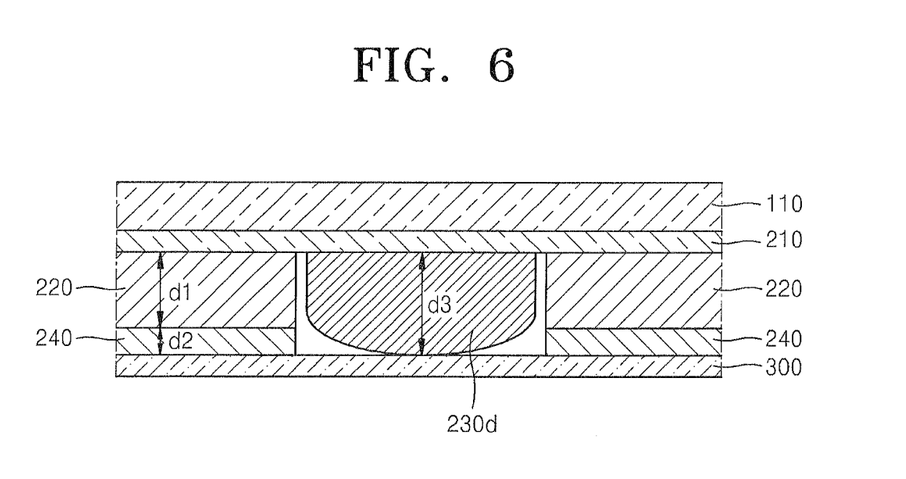

Referring to FIG. 6, the buffer 200 includes the peripheral buffer 220 and a central buffer 230d that is enclosed by the peripheral buffer 220 and has a lower part that has a convexly curved shape. The peripheral buffer 220 and the central buffer 230d keep a predetermined distance from each other. The central buffer 230d may be formed through injection molding to have the lower part with the convexly curved shape.

A sum d1+d2 of a thickness d1 of the peripheral buffer 220 and a thickness d2 of the second adhesive layer 240 is equal to a thickness d3 of the central buffer 230d measured from its uppermost part to its lowermost part. Therefore, the bezel 300 contacts a lower surface of the second adhesive layer 240 and the lowermost part of the central buffer 230d.

Figure 7:
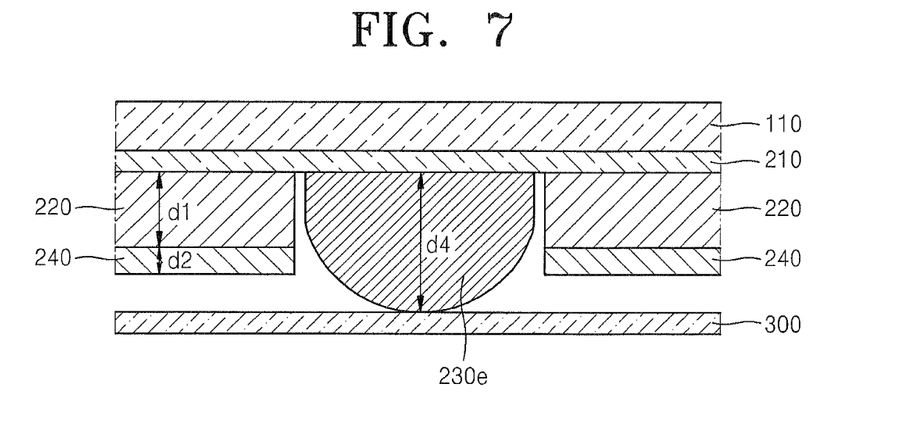

Referring to FIG. 7, the buffer 200 includes the peripheral buffer 220 and a central buffer 230e that is enclosed by the peripheral buffer 220 and has a lower part with a convexly curved shape. The peripheral buffer 220 and the central buffer 230e keep a predetermined distance from each other. The central buffer 230e may be formed through injection molding to have the lower part with the convexly curved shape.

Different from that shown in FIG. 6, a thickness d4 measured from an uppermost part to a lowermost part of the central buffer 230e may be greater than a sum d1+d2 of a thickness d1 of the peripheral buffer 220 and a thickness d2 of the second adhesive layer 240.

Therefore, the bezel 300 may contact the lowermost part of the central buffer 230e. The bezel 300 may not contact the second adhesive layer 240. Although the second adhesive layer 240 is disposed on a lower surface of the peripheral buffer 220, as illustrated in FIG. 7, the present invention is not limited thereto and the second adhesive layer 240 may be omitted.

Figure 8:
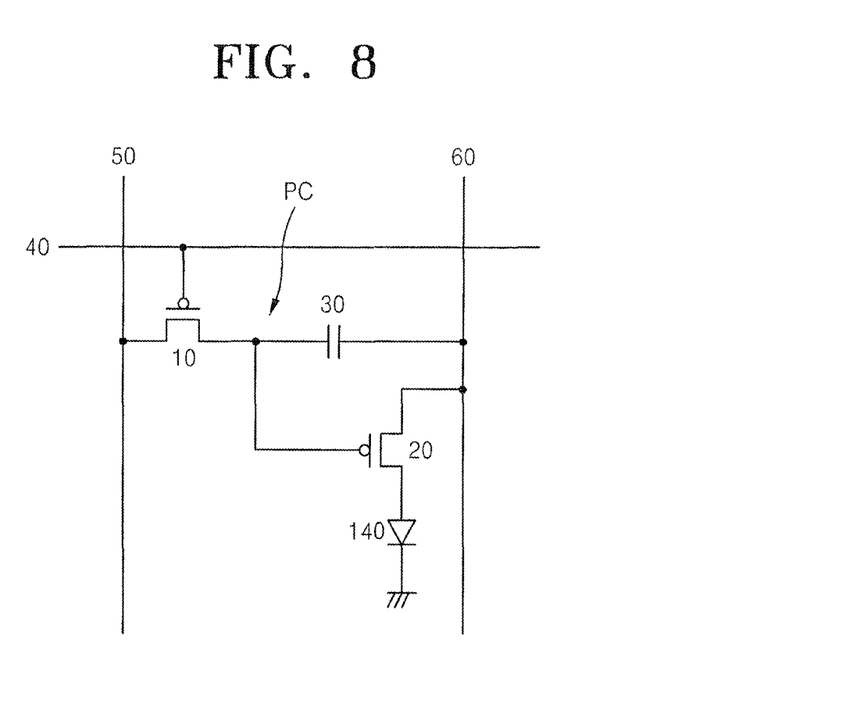
FIG. 8 is a circuit diagram illustrating a pixel circuit of a pixel of a display panel of FIG. 1, according to an exemplary embodiment of the present invention.

FIG. 8 is a circuit diagram illustrating a pixel circuit PC of a pixel of the display panel 100 of FIG. 1, according to an exemplary embodiment of the present invention. FIG. 9 is view illustrating a pixel structure of the display panel 100, according to an exemplary embodiment of the present invention. FIG. 10 is a cross-sectional view of the display panel 100 taken along line VI-VI of FIG. 9, according to an exemplary embodiment of the present invention. An internal structure of the display panel 100 of an OLED display will now be described in detail with reference to FIGS. 8 through 10.

Referring to FIG. 8, the OLED display includes a plurality of pixels that are connected to a plurality of signal lines and arranged in a matrix form, and each of the pixels includes a pixel circuit PC. A pixel may refer to a minimum unit that displays an image, and the display panel 100 displays an image through a plurality of pixels.

Each pixel includes a connection to a data line 50, a gate line 40, and a common power line 60 that is a driving power source of an OLED 140. The pixel circuit PC is electrically connected to the data line 50, the gate line 40, and the common line 60 and controls light emission of the OLED 140.

Each pixel includes at least two TFTs that are a switching TFT 10 and a driving TFT 20, a capacitor 30, and the OLED 140.

The switching TFT 10 is turned on and/or off by a gate signal applied to the gate line 40 to transmit a data signal applied to the data line 50 to the capacitor 30 and the driving TFT 20. A switching device is not limited to the switching TFT 10. Therefore, a switching circuit including a plurality of TFTs and a plurality of capacitors may be included or a circuit that compensates for a voltage threshold value of the driving TFT 20 or a circuit that compensates for a voltage drop of the common power line 60 may be included.

The driving TFT 20 determines an amount of current flowing into the OLED 140 according to a data signal transmitted through the switching TFT 10.

The capacitor 30 stores the data signal transmitted through the switching TFT 10 for one frame.

The driving TFT 20 and the switching TFT 10 are shown as p-channel metal oxide semiconductor (PMOS) TFTs. However, the present invention is not limited thereto, and at least one of the driving TFT 20 and the switching TFT 10 may be formed as an n-channel metal oxide semiconductor (NMOS) TFT. The number of TFTs and the number of capacitors as described above are not limited thereto, and a larger number of TFTs and a larger number of capacitors may be included.

Referring to FIGS. 9 and 10, the display panel 100 includes the switching TFT 10, the driving TFT 20, the capacitor 30, and the OLED 140 that are formed in one pixel. Here, a structure including the switching TFT 10, the driving TFT 20, and the capacitor 30 is referred to as a driving circuit unit 130.

The display panel 100 further includes the gate line 40 that is arranged in one direction, the data line 50 that intersects with the gate line 40 and is insulated from the gate line 40, and the common power line 60. Here, one pixel may be defined as a boundary between the gate line 40, the data line 50, and the common power line 60 but the present invention is not limited thereto.

FIG. 9 illustrates an active matrix (AM) type OLED display having a 2 transistor-1 capacitor structure including two TFTs and one capacitor in one pixel. However, the present invention is not limited thereto, and the OLED display may include three or more TFTs and two or more capacitors in one pixel and may further include an additional line to have various structures.

The OLED 140 includes a pixel electrode 141, an organic emission layer 143 that is formed on the pixel electrode 141, and a common electrode 145 that is formed on the organic emission layer 143. Here, the pixel electrode 141 is a hole injection electrode having a positive polarity, and the common electrode 145 is an electron injection electrode having a negative polarity. However, the present invention is not limited thereto, and the pixel electrode 141 may have a negative polarity, and the common electrode 145 may have a positive polarity depending on a driving method of the OLED display. Holes and electrons are respectively injected from the pixel electrode 141 and the common electrode 145 into the organic emission layer 143. When an exciton in which the injected holes and electrons are combined drops from an excitation state to a ground state, light emission occurs.

The organic emission layer 143 is formed in an opening to form an additional light-emitting material in each pixel. However, the present invention is not limited thereto, and the organic emission layer 143 may be formed all over regardless of positions of pixels. Here, layers including light-emitting materials emitting red (R), green (G), and blue (B) light may be vertically stacked or combined with one another to form the organic emission layer 143. If white light is emitted, different colors may be combined. A color conversion layer or a color filter that converts the emitted white light into a predetermined color may be further included.

In an OLED display according to an exemplary embodiment of the present invention, the OLED 140 may emit light toward the sealing layer 150. In other words, the OLED 140 is a top emission type. Here, a reflective electrode may be used as the pixel electrode 141, and a transmissive or transreflective electrode may be used as the common electrode 145 so that the OLED 140 emits light toward the sealing layer 150.

However, the OLED display is not limited to a top emission type display, and thus the OLED display may be a bottom emission type or a dual emission type display.

The capacitor 30 includes a pair of capacitor plates 31 and 33 that have an interlayer dielectric layer 80 disposed therebetween. Here, the interlayer dielectric layer 80 is a dielectric. A capacitance is determined by charges charged by the capacitor 30 and a voltage between the capacitor plates 31 and 33.

The switching TFT 10 includes a switching semiconductor layer 11, a switching gate electrode 13, a switching source electrode 15, and a switching drain electrode 17. The driving TFT 20 includes a driving semiconductor layer 21, a driving gate electrode 23, a driving source electrode 25, and a driving drain electrode 27.

A TFT having a top gate structure is illustrated in FIG. 10. However, the present invention is not limited thereto, and a TFT having a bottom gate structure may be used. In addition, the switching semiconductor layer 11 and the driving semiconductor layer 21 may be formed of polycrystalline silicon. However, the present invention is not limited thereto, and the switching semiconductor layer 11 and the driving semiconductor layer 21 may be formed of an oxide semiconductor. For example, the oxide semiconductor may include Group 12, Group 13, and Group 14 metal elements, such as zinc (Zn), indium (In), gallium (Ga), tin (Sn), cadmium (Cd), germanium (Ge), hafnium (Hf), and oxide of a material selected from combinations thereof. For example, a semiconductor active layer may include G-I-Z-O[$(In2O3)a(Ga2O3)b(ZnO)c$] (where a, b, and c are real numbers that satisfy a≥0, b≥0, c>0).

The switching TFT 10 is used as a switching element that selects a pixel from which light is to be emitted. The switching gate electrode 13 is connected to the gate line 40. The switching source electrode 15 is connected to the data line 50. The switching drain electrode 17 is spaced apart from the switching source electrode 15 and is connected to the capacitor plate 31.

The driving TFT 20 applies driving power to the pixel electrode 141 in order for the organic emission layer 143 of the OLED 140 to emit light in a selected pixel. The driving gate electrode 23 is connected to the capacitor plate 31 that is connected to the switching drain electrode 17. The driving source electrode 25 and the capacitor plate 33 are connected to the common power line 60. The driving drain electrode 27 is connected to the pixel electrode 141 of the OLED 140 through a contact hole.

In this structure, the switching TFT 10 operates due to a gate voltage applied to the gate line 40 to transmit a data voltage applied to the data line 50 to the driving TFT 20. A voltage corresponding to a difference between a common voltage applied from the common power line 60 to the driving TFT 20 and the data voltage transmitted from the switching TFT 10 is stored in the capacitor 30. In addition, a current corresponding to the voltage stored in the capacitor 30 flows to the OLED 140 through the driving TFT 20 to allow the OLED 140 to emit light.

As shown in FIG. 10, the sealing layer 150 is disposed on the OLED 140 to protect the OLED 140 and the driving circuit unit 130. One or more organic layers 153 and one or more inorganic layers 151 and 155 are alternately stacked to form the sealing layer 150.

A plurality of inorganic layers 151/155 or a plurality of organic layers 153 may be included.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting diode (OLED) display, comprising:
   a display panel;
   a bezel on which the display panel is mounted; and
   a buffer disposed between a lower surface of the display panel and the bezel,
   wherein the buffer comprises a peripheral buffer and a central buffer that has a step-shaped structure, wherein the peripheral buffer is disposed at first and second sides of the central buffer.

2. The OLED display of claim 1, wherein the central buffer has a width that decreases from the lower surface of the display panel toward the bezel.

3. The OLED display of claim 1, wherein the peripheral buffer and the central buffer are spaced apart from each other.

4. The OLED display of claim 1, wherein the central buffer comprises:
   a first central buffer disposed on the lower surface of the display panel; and
   a second central buffer disposed on a lower surface of the first central buffer,
   wherein a width of the second central buffer is less than a width of the first central buffer.

5. The OLED display of claim 4, wherein the central buffer comprises:
   a third central buffer disposed on a lower surface of the second central buffer,
   wherein a width of the third central buffer is less than the width of the second central buffer.

6. The OLED display of claim 1, wherein a side of the peripheral buffer contacts the first or second side of the central buffer.

7. The OLED display of claim 1, wherein the buffer comprises:
   a first adhesive layer disposed between a substrate and the peripheral buffer and between the substrate and the central buffer.

8. The OLED display of claim 1, wherein the buffer comprises:
   a second adhesive layer disposed on a lower surface of the peripheral buffer.

9. The OLED display of claim 8, wherein the second adhesive layer includes a conductive adhesive layer.

10. The OLED display of claim 8, wherein a lower surface of the second adhesive layer and a lower surface of the central buffer contact the bezel.

11. The OLED display of claim 1, wherein the peripheral buffer includes sponge or urethane.

12. The OLED display of claim 1, wherein the central buffer includes silicon, a polyethylene film, or rubber.

13. The OLED display of claim 1, wherein the bezel comprises:
   a bottom part on which the display panel is mounted; and
   a sidewall which extends from an edge of the bottom part to face a side of the display panel.

14. An organic light-emitting diode (OLED) display, comprising:
   a display panel;
   a bezel on which the display panel is mounted; and
   a buffer disposed between a lower surface of the display panel and the bezel,
   wherein the buffer comprises a peripheral buffer and a central buffer that has a lower part with a convexly curved surface, wherein the peripheral buffer is disposed at first and second sides of the central buffer.

15. The OLED display of claim 14, wherein the peripheral buffer and the central buffer are spaced apart from each other.

16. The OLED display of claim 14, wherein the buffer comprises:
   a first adhesive layer disposed between a substrate and the peripheral buffer and between the substrate and the central buffer.

17. The OLED display of claim 14, wherein the buffer comprises:
   a second adhesive layer disposed on a lower surface of the peripheral buffer.

18. The OLED display of claim 17, wherein a lower surface of the second adhesive layer and a lower surface of the central buffer contact the bezel.

19. The OLED display of claim 17, wherein a thickness of the central buffer from an uppermost part of the central buffer to a lowermost part of the central buffer is greater than a sum of a thickness of the peripheral buffer and a thickness of the second adhesive layer.

* * * * *